United States Patent
Ma

(10) Patent No.: US 10,497,454 B2
(45) Date of Patent: Dec. 3, 2019

(54) SHIFT REGISTER, OPERATION METHOD THEREOF, GATE DRIVING CIRCUIT AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 172 days.

(21) Appl. No.: 15/547,971

(22) PCT Filed: Feb. 13, 2017

(86) PCT No.: PCT/CN2017/073385
§ 371 (c)(1),
(2) Date: Aug. 1, 2017

(87) PCT Pub. No.: WO2017/206542
PCT Pub. Date: Dec. 7, 2017

(65) Prior Publication Data
US 2018/0233209 A1   Aug. 16, 2018

(30) Foreign Application Priority Data

May 30, 2016   (CN) .......................... 2016 1 0371246

(51) Int. Cl.
| G11C 19/00 | (2006.01) |
| G11C 19/28 | (2006.01) |
| G09G 3/36 | (2006.01) |
| H01L 27/12 | (2006.01) |
| G09G 3/20 | (2006.01) |

(52) U.S. Cl.
CPC ............... *G11C 19/28* (2013.01); *G09G 3/20* (2013.01); *G09G 3/36* (2013.01); *H01L 27/1214* (2013.01); *G09G 3/3677* (2013.01); *G09G 2310/0267* (2013.01); *G09G 2310/0286* (2013.01)

(58) Field of Classification Search
None
See application file for complete search history.

(56) References Cited

U.S. PATENT DOCUMENTS 9,754,531 B2 *   9/2017   Ji ............................. G09G 3/32
9,805,638 B2 *  10/2017   Ma ......................... G11C 19/28
(Continued)

FOREIGN PATENT DOCUMENTS

| CN | 1758321 A | 4/2006 |
| CN | 101939791 A | 1/2011 |

(Continued)

OTHER PUBLICATIONS

Chinese Office Action in Chinese Application No. 201610371246.9, dated Jan. 19, 2018 with English translation.

(Continued)

*Primary Examiner* — Tuan T Lam
(74) *Attorney, Agent, or Firm* — Collard & Roe, P.C.

(57) ABSTRACT

A shift register and an operation method thereof as well as a gate driving circuit and a display device. The shift register includes The shift register includes an input module, a pull-up module, a pull-up control module, an output module, and a noise reducing module. It can reduce noises at the output terminal effectively.

18 Claims, 3 Drawing Sheets

(56) References Cited

U.S. PATENT DOCUMENTS

| | | | |
|---|---|---|---|
| 9,898,958 B2* | 2/2018 | Ma | G09G 3/36 |
| 2007/0242018 A1 | 10/2007 | Park | |
| 2011/0001732 A1 | 1/2011 | Morii et al. | |
| 2011/0044423 A1 | 2/2011 | Lin et al. | |
| 2016/0105184 A1* | 4/2016 | Qian | H03K 19/0944 |
| | | | 345/214 |
| 2016/0117963 A1* | 4/2016 | Chung | G09G 3/3208 |
| | | | 345/208 |
| 2016/0225341 A1* | 8/2016 | Ma | G09G 3/20 |
| 2016/0293090 A1* | 10/2016 | Long | G09G 3/2092 |
| 2016/0372041 A1* | 12/2016 | Sun | G09G 3/20 |
| 2016/0379558 A1* | 12/2016 | Jeon | G09G 3/3225 |
| | | | 345/213 |
| 2017/0140836 A1 | 5/2017 | Ma | |
| 2017/0186360 A1* | 6/2017 | Ma | G11C 19/28 |
| 2017/0200419 A1* | 7/2017 | Ma | G09G 3/3266 |
| 2017/0278450 A1* | 9/2017 | Ma | G09G 3/2092 |
| 2018/0047341 A1* | 2/2018 | Ma | G09G 3/3677 |

FOREIGN PATENT DOCUMENTS

| | | |
|---|---|---|
| CN | 103000120 A | 3/2013 |
| CN | 103000155 A | 3/2013 |
| CN | 104537980 A | 4/2015 |
| CN | 104835531 A | 8/2015 |
| CN | 106057143 A | 10/2016 |

OTHER PUBLICATIONS

International Search Report of PCT/CN2017/073385 in Chinese, dated Apr. 28, 2017 with English translation.

Notice of Transmittal of the International Search Report of PCT/CN2017/073385 in Chinese, dated Apr. 28, 2017.

Written Opinion of the International Searching Authority of PCT/CN2017/073385 in Chinese, dated Apr. 28, 2017 with English translation of relevant parts.

* cited by examiner

US 10,497,454 B2

SHIFT REGISTER, OPERATION METHOD THEREOF, GATE DRIVING CIRCUIT AND DISPLAY DEVICE

CROSS REFERENCE TO RELATED APPLICATIONS

This application is the National Stage of PCT/CN2017/073385 filed on Feb. 13, 2017, which claims priority under 35 U.S.C. § 119 of Chinese Application No. 201610371246.9 filed on May 30, 2016, the disclosure of which is incorporated by reference.

TECHNICAL FIELD

The present disclosure relates to a shift register and an operation method thereof as well as a gate driver circuit and a display device.

BACKGROUND

Thin film transistor-liquid crystal displays (TFT-LCDs) are widely used in various fields of production and living, and use an M*N progressive scanning matrix to display. During display of a TFT-LCD, pixels in the display panel are respectively driven to display through driving circuits. The driving circuits of a TFT-LCD mainly include a gate driving circuit and a data driving circuit. The data driving circuit is used to sequentially latch the input data in accordance with the timing of a clock signal, convert the latched data into analog signals, and input the analog signals to data lines of the display panel. The gate driving circuit is typically implemented with shift registers, which convert a clock signal into on/off voltages and inputs them to gate lines of the display panel. Each of the gate lines of the display panel is typically coupled with one shift register (i.e., one stage of shift register). Pixels in the display panel are progressively scanned by shift registers which output turn-on voltages in turn.

In a traditional amorphous silicon process, the fabricated amorphous silicon thin film transistors (a-Si TFTs) have characteristics of poor stability and circuits designed with them for display driving are relatively complex. However, thin film transistors fabricated through a low-temperature poly-silicon process have relatively stable performance and circuits designed with them for display driving are relatively simple and have stable performance.

SUMMARY

The present disclosure provides a shift register and an operation method thereof as well as a gate driving circuit and a display device, which can reduce noises at the output terminal of the shift register and improve working stability.

An aspect of the present disclosure provides a shift register, comprising: an input module, a first terminal of the input module being connected with an input terminal of the shift register to receive an input signal therefrom, a second terminal of the input module being connected with a first clock signal terminal, and a third terminal of the input module being connected with a first node; a pull-up module, a first terminal of the pull-up module being connected with a first supply voltage terminal, a second terminal of the pull-up module being connected with a second node, and a third terminal of the pull-up module being connected with an output terminal; a pull-up control module, a first terminal of the pull-up control module being connected with the first clock signal terminal, a second terminal of the pull-up control module being connected with a second supply voltage terminal, a third terminal of the pull-up control module being connected with the second node, and a fourth terminal of the pull-up control module being connected with the first node; an output module, a first terminal of the output module being connected with the first node, a second terminal of the output module being connected with the second clock signal terminal, and a third terminal of the output module being connected with the output terminal; and a noise reducing module, a first terminal of the noise reducing module being connected with the second node, a second terminal of the noise reducing module being connected with the second clock signal terminal, a third terminal of the noise reducing module being connected with the first supply voltage terminal, and a fourth terminal of the noise reducing module being connected with the first node.

Another aspect of the present disclosure provides an operation method for a shift register comprising an input module, a pull-up module, a pull-up control module, an output module and a noise reducing module, the operation method comprising: transferring a received input signal to a first node by the input module; outputting a second clock signal at a second clock signal terminal to an output terminal by the output module; controlling the pull-up module to operate or not operate by the pull-up control module; pulling the output signal at the output terminal up to a supply voltage at a first supply voltage terminal by the pull-up module; and maintaining a level at the first node to reduce noises at the output terminal of the shift register by the noise reducing module.

Still another aspect of the disclosure provides a gate driving circuit comprising a plurality of shift registers connected in series, each of the shift registers being the above-mentioned shift register, among the plurality of shift registers connected in series, the first shift register receives a frame starting signal input through its input terminal, and except the last shift register, each of remaining shift registers has an output terminal thereof connected with the input terminal of a subsequently adjacent shift register.

Further still another aspect of the disclosure provides a display device comprising the above-mentioned gate driving circuit.

In the shift register in accordance with embodiments of the present disclosure, noises at the output terminal are continually released during the idle time period of the shift register, so that noises at the output terminal are eliminated, working stability is enhanced and service life is prolonged; meanwhile, because a relatively small number of transistors are used in the shift register in accordance with embodiments of the present disclosure, a liquid crystal display designed with a narrow frame can be achieved.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Transistors used in all embodiments of the present disclosure may be thin film transistors or field effect transistors, or other devices having like characteristics. In the present embodiment, the drain and source of each transistor are connected in an interchangeable way, and thus there is no actual difference between drains and sources of respective transistors in embodiments of the present disclosure. At this point, only in order to discriminate between the two electrodes of a transistor other than its gate, one of them is referred to as a drain while the other is referred to as a source.

The present disclosure provides a shift register, which can reduce noises at its output terminal.

Figure 1:
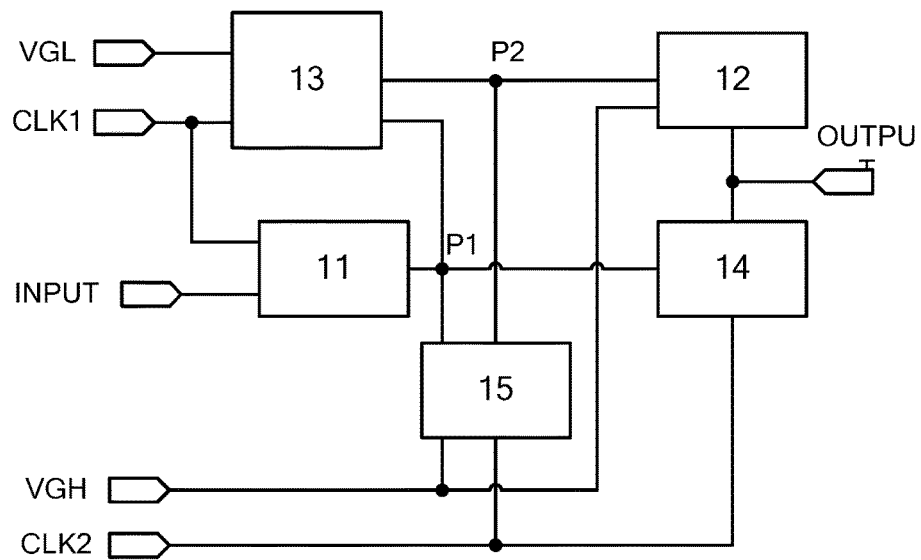
FIG. 1 is a block diagram illustrating a shift register in accordance with an embodiment of the present disclosure.

FIG. 1 is a block diagram illustrating a shift register in accordance with an embodiment of the present disclosure. As illustrated in FIG. 1, in an embodiment, the shift register includes an input module 11, a pull-up module 12, a pull-up control module 13, an output module 14, and a noise reducing module 15.

The input module 11 has a first terminal connected with an input terminal INPUT of the shift register to receive input signals from the input terminal INPUT, a second terminal connected with a first clock signal terminal CLK1, and a third terminal connected with a first node P1. The input module 11 is configured to transfer the received input signals to the first node P1 under the control of a first clock signal at the first clock signal terminal CLK1.

The pull-up module 12 has a first terminal connected with a first supply voltage terminal VGH, a second terminal connected with a second node P2, and a third terminal connected with an output terminal OUTPUT. The pull-up module 12 is configured to pull the output signal at the output terminal OUTPUT up to the supply voltage at the first supply voltage terminal VGH under the control of the signal at the second node P2.

The pull-up control module 13 has a first terminal connected with the first clock signal terminal CLK1, a second terminal connected with a second supply voltage terminal VGL, a third terminal connected with the second node P2, and a fourth terminal connected with the first node P1. The pull-up module 13 is configured to control the pull-up module 12 to operate or not. For example, the pull-up control module 13 controls the pull-up module 12 to operate or not operate in accordance with the first clock signal at the first clock signal terminal CLK1 and the signal at the first node P1.

The output module 14 has a first terminal connected with the first node P1, a second terminal connected with a second clock signal terminal CLK2, and a third terminal connected with the output terminal OUTPUT. The output module 14 is configured to output the second clock signal at the second clock signal CLK2 to the output terminal OUTPUT under the control of the signal at the first node P1.

The noise reducing module 15 has a first terminal connected with the second node P2, a second terminal connected with the second clock signal terminal CLK2, a third terminal connected with the first supply voltage terminal VGH, and a fourth terminal connected with the first node P1.

The noise reducing module 15 is configured to reduce noises at the output terminal of the shift register by maintaining the level at the first node P1.

The first clock signal at the first clock signal terminal CLK1 and the second clock signal at the second clock signal terminal CLK2 are opposite in phase.

The first supply voltage terminal VGH is a high supply voltage terminal, and the second supply voltage terminal VGL is a low supply voltage terminal.

Figure 2:
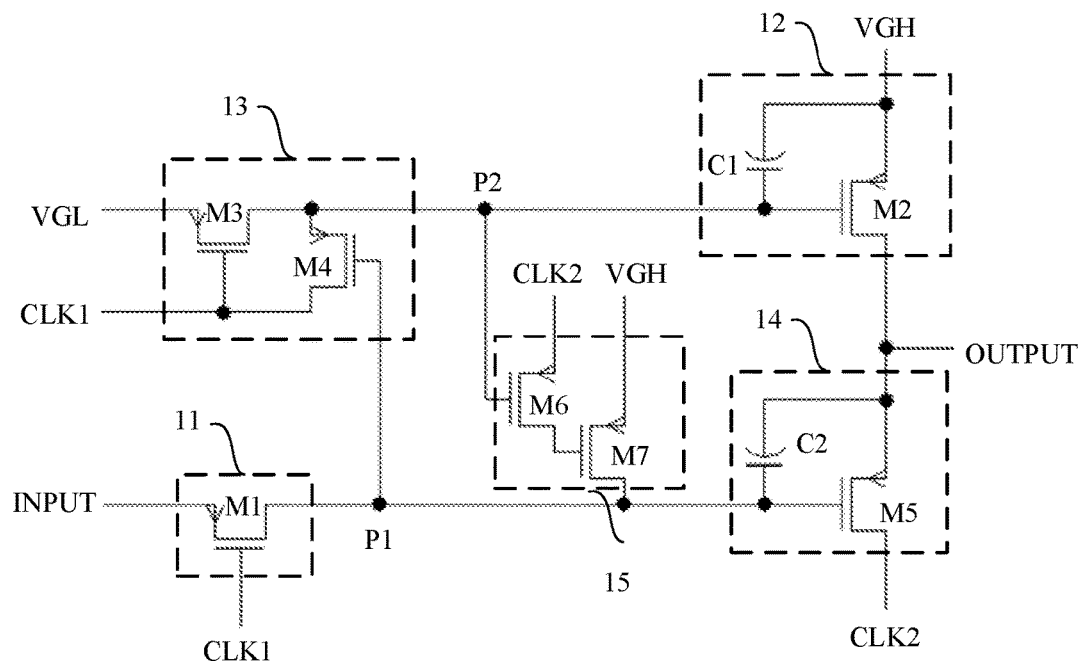
FIG. 2 is a schematic diagram illustrating an exemplary circuit structure of a shift register in accordance with an embodiment of the present disclosure.

FIG. 2 is a schematic diagram illustrating an exemplary circuit structure of a shift register in accordance with an embodiment of the present disclosure. The following description will be given in the case that transistors in FIG. 2 are all p-type transistors that are turned on when low levels are input to their gates.

As illustrated in FIG. 2, in an embodiment, for example, the input module 11 includes an input transistor M1, of which the gate is connected with the first clock signal terminal CLK1, the first electrode is connected with the input terminal INPUT and the second electrode is connected with the first node P1. When the first clock signal at the first clock signal terminal CLK1 is at a low level, the input transistor M1 is turned on, so that the input signal from the input terminal INPUT is transferred to the first node P1.

In an embodiment, for example, the pull-up module 12 includes an output pull-up transistor M2 and a capacitor C1, the gate of the output pull-up transistor M2 is connected with the second node P2 and the first terminal of the first capacitor C1, the first electrode of the output pull-up transistor M2 is connected with the first supply voltage terminal VGH and the second terminal of the first capacitor C1, and the second electrode of the output pull-up transistor M2 is connected with the output terminal OUTPUT. When the signal at the second node P2 is at a low level, the output pull-up transistor M2 is turned on to pull the output signal at the output terminal OUTPUT up to the supply voltage at the first supply voltage terminal VGH.

In an embodiment, for example, the pull-up control module 13 includes a first pull-up control transistor M3 and a second pull-up control transistor M4. The first pull-up control transistor M3 has its gate connected with the first clock signal terminal CLK1, its first electrode connected with the second supply voltage terminal VGL and its second electrode connected with the second node P2, while the second pull-up control transistor M4 has its gate connected with the first node P1, its first electrode connected with the second node P2 and its second electrode connected with the first clock signal terminal CLK1. For example, when the first clock signal at the first clock signal terminal CLK1 is at a low level, the first pull-up control transistor M3 is turned on to pull the signal at the second node P2 down to the supply voltage at the second supply voltage terminal VGL; when the signal at the first node P1 is at a low level and the first clock signal at the first clock signal terminal CLK1 is at a high level, the second pull-up control transistor M4 is turned on to pull the signal at the second node P2 up to the first clock signal at the high level.

In an embodiment, for example, the output module 14 includes an output transistor M5 and a second capacitor C2, a gate of the output transistor M5 is connected with the first terminal of the second capacitor C2 and the first node P1, a first electrode of the output transistor M5 is connected with the second terminal of the second capacitor C2 and the output terminal OUTPUT, and a second electrode of the output transistor M5 is connected with the second clock signal terminal CLK2. When the signal at the first node P1 is at a low level, the output transistor M5 is turned on to output the second clock signal at the second clock signal terminal CLK2 to the output terminal OUTPUT.

In an embodiment, for example, the noise reducing module 15 includes a node control transistor M6 and a node potential maintaining transistor M7. The node control transistor M6 has its gate connected with the second node P2, its first electrode connected with the second clock signal terminal CLK2 and its second electrode connected with the gate of the node potential maintaining transistor M7, while the node potential maintaining transistor M7 has its first electrode connected with the first supply voltage terminal VGH and its second electrode connected with the first node P1. When the signal at the second node P2 is at a low level, the node control transistor M6 is turned on to output the second clock signal at the second clock signal terminal CLK2 to the gate of the node potential maintaining transistor M7; when the node control transistor M6 is turned on and the second clock signal at the second clock signal terminal CLK2 is at a low level, the node potential maintaining transistor M7 is turned on to output the supply voltage at the first supply voltage terminal VGH to the first node P1.

When the node control transistor M6 is turned on and the second clock signal at the second clock signal terminal CLK2 is at a high level, the node potential maintaining transistor M7 is turned off to prevent the supply voltage at the first supply voltage terminal VGH from influencing the potential at the gate of the output transistor MCLK 5; when the node control transistor M6 is turned on and the second clock signal at the second clock signal terminal CLK2 is at a low level, the node potential maintaining transistor M7 is turned on to output the supply voltage at the first supply voltage terminal VGH to the first node P1, so that the potential at the gate of the output transistor M5 has no change to follow the operation that the second clock signal at the second clock signal terminal CLK2 is pulled down. As a result, no abnormal problem occurs to the output from the output transistor M5, ensuring stability of the output from the output terminal OUTPUT and noise reduction.

It can be appreciated that the specific circuit structures of the input module 11, the pull-up module 12, the pull-up control module 13, the output module 14 and the noise reducing module 15 as illustrated in FIG. 2 are only provided for illustration and other appropriate circuit structures may be applied to those modules as long as respective functions of those modules can be achieved. The present disclosure is not limited in this respect.

Figure 3:
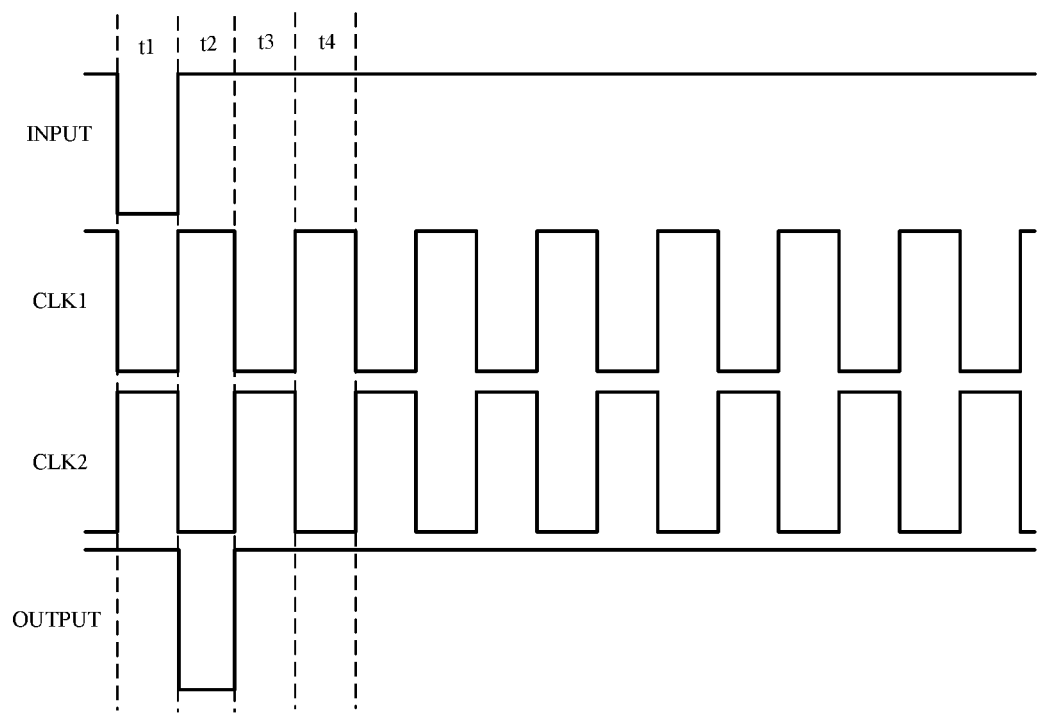
FIG. 3 is a timing diagram for the shift register as illustrated in FIG. 2 performing scan.

FIG. 3 is a timing diagram for the shift register in FIG. 2 performing scan. The specific working process of a shift register performing scan in an embodiment of the present disclosure will be described in the following with reference to FIGS. 2 and 3.

In the present embodiment, the first supply voltage terminal VGH is a high supply voltage terminal while the second supply voltage terminal VGL is a low supply voltage terminal.

During the first phase t1 (the input phase), the signal input through the input terminal INPUT and the first clock signal at the first clock signal terminal CLK1 are at low levels while the second clock signal at the second clock signal terminal CLK2 is at a high level. The input transistor M1 is turned on to transfer the low level signal at the input terminal INPUT to the first node P1, and then the first node P1 is at a low level, so that the low level signal is written into the second capacitor C2 and the gate of the output transistor M5, turning on the output transistor M5. At this point, because the second clock signal at the second clock signal terminal CLK is at a high level, the output terminal OUTPUT also outputs a high level. Moreover, in this phase, because the first clock signal at the first clock signal terminal CLK1 is at a low level, the first pull-up control transistor M3 is turned on to transfer the low level at the second supply voltage terminal VGL to the second node P2, and furthermore because the first node P1 is at a low level, the second pull-up control transistor M4 is turned on to transfer the first clock signal having a low level at the first clock signal terminal CLK1 to the second node P2 and thus place the second node P2 at a low level, writing the low level signal into the first capacitor C1 and the gate of the output pull-up transistor M2. As a result, the transistor M2 is turned on to write the signal having the high level at the first supply voltage terminal VGH to the output terminal OUTPUT, thus the output terminal OUTPUT outputs a high level. At the same time, because the second node P2 is at a low level, the node control transistor M6 is turned on to input the second clock signal having a high level at the second clock signal terminal CLK2 to the gate of the node potential maintaining transistor M7, so that the transistor M7 is turned off to prevent the signal at the first supply voltage terminal VGH from influencing the potential at the gate of the output transistor M5.

During the second phase t2 (the output phase), the signal input through the input terminal INPUT and the first clock signal at the first clock signal terminal CLK1 are at high levels while the second clock signal at the second clock signal terminal CLK2 is at a low level. The input transistor M1 is turned off. At this point, the gate potential of the output transistor M5 that is stored in the second capacitor C2 is pulled down by the gate-drain coupling capacitance of the M5 to turn on the M5, so that the second clock signal having a low level at the second clock signal terminal CLK2 is written to the output terminal OUTPUT, thus the output terminal OUTPUT outputs a low level. Meanwhile, the second pull-up control transistor M4 continues to be turned on to input the first clock signal having a high level at the first clock signal terminal CLK1 to the second node P2, ensuring that the pull-up transistor M2 continues to be turned off without influencing the output from the output terminal OUTPUT. The node control transistor M6 continues to be turned off, and as a result the node potential maintaining transistor M7 is turned off, preventing the supply voltage signal at the first supply voltage terminal VGH from influencing the gate potential of the output transistor M5.

During the third phase t3 (the pull-up phase), the signal input through the input terminal INPUT and the second clock signal at the second clock signal terminal CLK2 are at high levels while the first clock signal at the first clock signal terminal CLK1 is at a low level. The input transistor M1 is turned on to transfer the high level at the input terminal INPUT to the first node P1. At this point the first node P1 is at a high level, so that a high level signal is written into the second capacitor C2 and the gate of the output transistor M5, turning off the output transistor M5. Because the first node P1 is at a high level, the second pull-up control transistor M4 is also turned off. Because the first clock signal at the first clock signal terminal CLK1 is at a low level, the first pull-up control transistor M3 is turned on to transfer the low level at the second supply voltage terminal VGL to the second node P2 and thus place the second node P2 at a low level, writing a low level signal into the first capacitor and the gate of the output pull-up transistor M2. As a result, the M2 is turned on to write the signal having a high level at the first supply voltage terminal VGH to the output terminal OUTPUT, thus the output terminal OUTPUT outputs a high level. The node control transistor M6 is turned on to write the second clock signal at the second clock signal terminal CLK2 into the gate of the node potential maintaining transistor M7, so that the node potential maintaining transistor M7 is turned off, preventing the supply voltage signal at the first supply voltage terminal VGH from influencing the gate potential of the output transistor M5.

During the fourth phase t4 (the maintaining phase), the signal input through the input terminal INPUT and the first clock signal at the first clock signal terminal CLK1 are at high levels while the second clock signal at the second clock signal terminal CLK2 is at a low level. The first pull-up control transistor M3 and the second pull-up control transistor M4 are turned off. The potential at the second node P2 is still of the low level at the second supply voltage terminal VGL that is maintained in the previous phase by the first capacitor C1, so that the output pull-up transistor M2 and the node control transistor M6 are turned on. Because the output pull-up transistor M2 is turned on, the signal at the first supply voltage terminal VGH is written to the output terminal OUTPUT, and the output terminal OUTPUT then outputs a high level. Because the node control transistor M6 is turned on, the second clock signal having a low level at the second clock signal terminal CLK2 is written into the gate of the node potential maintaining transistor M7, so that the node potential maintaining transistor M7 is turned on and the signal having a high level at the first supply voltage terminal VGH is written into the first node P1, and also, a high level signal is written into the capacitor C2 and the gate of the output transistor M5 to turn off the output transistor M5 and thus prevent the gate potential of the output transistor M5 from changing to follow the operation that the second clock signal at the second clock signal terminal CLK2 is pulled down, so that no abnormal problem occurs to the output from the output transistor M5, ensuring stable stability of the output from the output terminal OUTPUT and noise reduction.

Hereafter, the third and fourth phases t3 and t4 are repeated until the next frame arrives. Upon arrival of the next frame, the input terminal INPUT of the shift register receives a low level signal and then the first phase t1 will be performed again.

It can be seen from FIG. 3 that the first clock signal at the first clock signal terminal CLK1 and the second clock signal at the second clock signal terminal CLK2 are opposite in phase.

As can be seen from the description above, in the shift register in accordance with the embodiment of the present disclosure, noises at the output terminal OUTPUT are continually released during the idle time period of the shift register to make the output terminal OUTPUT always be maintained at a high level except in operation time period when the shift register outputs driving signals, so that noises at the output terminal are eliminated, working stability is enhanced and service life is prolonged; meanwhile, because a relatively small number of transistors are used in the shift register in accordance with the embodiment of the present disclosure, a liquid crystal display designed with a narrow frame can be achieved.

The present disclosure further provides an operation method for the shift register described above. The method will be explained with reference to FIGS. 1 and 3 hereafter. In an embodiment, for example, as illustrated in FIG. 1, the shift register includes an input module 11, a pull-up module 12, a pull-up control module 13, an output module 14, and a noise reducing module 15. The operation method for the shift register includes: transferring a received input signal to the first node P1 by the input module 11; outputting the second clock signal at the second clock signal terminal CLK2 to the output terminal OUTPUT by the output module 14; controlling the pull-up module 12 to operate or not operate by the pull-up control module 13; pulling the output signal at the output terminal OUTPUT up to the supply voltage at the first supply voltage terminal VGH by the pull-up module 12; and maintaining the level at the first node P1 to reduce noises at the output terminal of the shift register by the noise reducing module 15.

In the present embodiment, the first supply voltage terminal VGH is a high supply voltage terminal, and the first clock signal at the first clock signal terminal CLK1 and the second clock signal at the second clock signal terminal CLK2 are opposite in phase.

Figure 4:
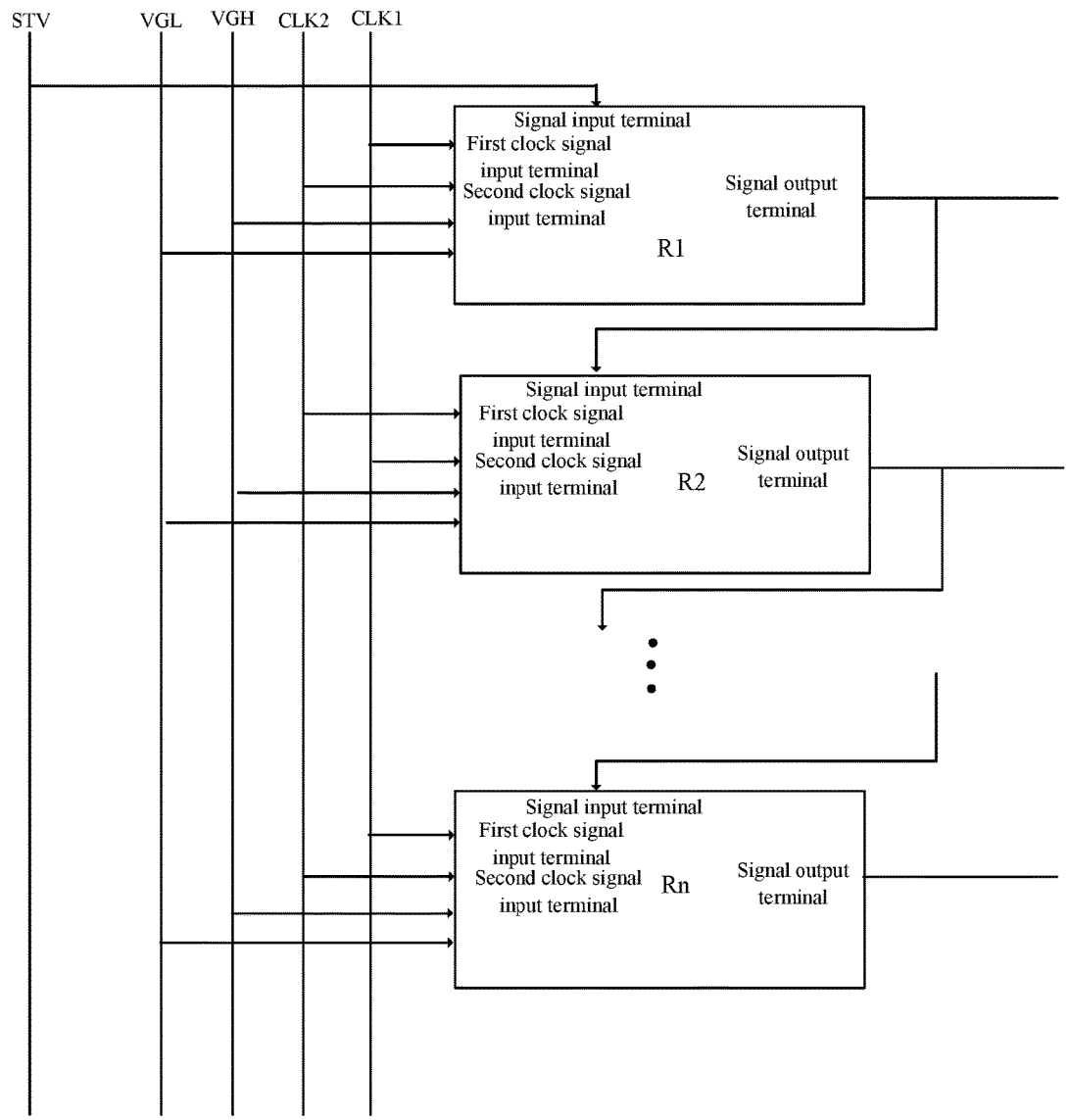
FIG. 4 is a schematic diagram illustrating a gate driving circuit formed by cascading a plurality of shift registers in accordance with an embodiment of the present disclosure.

FIG. 4 is a schematic diagram illustrating a gate driving circuit formed by cascading a plurality of shift registers in accordance with an embodiment of the present disclosure.

As illustrated in FIG. 4, in the gate driving circuit, a plurality of shift registers described above are connected in series. Among the plurality of shift registers, the first shift register R1 receives a frame starting signal STV input though its input terminal. Except the last shift register Rn, each of the remaining shift registers has its output terminal connected with the input terminal of the subsequently adjacent shift register.

In addition, as illustrated in FIG. 4, in the gate driving circuit, clock signals input through the first clock signal terminals of two adjacent stages of shift registers are opposite in phase and clock signals input through the second clock signal input terminals of the shift registers are also opposite in phase. For example, in the shift register R1, a CLK1 signal is input to the first clock signal input terminal and a CLK2 signal is input to the second clock signal input terminal, while, in the shift register R2, the CLK2 signal is input to the first clock signal input terminal and the CLK1 signal is input to the second clock signal input terminal, with the CLK1 signal and the CLK2 signal being opposite in phase.

In another aspect of the present disclosure, a display device including the gate driving circuit described above is disclosed.

The display devices may be any products or components with display functions, such as electronic papers, mobile telephones, tablet computers, TVs, displays, notebook computers, digital picture frames, navigators or the like.

What has been described above are only specific implementations of the present disclosure, and the scope claimed by the present disclosure is not limited to these; changes and alternations may readily occur to those skilled in the art in consideration of the technical disclosure of the present disclosure, which fall within the scope claimed by the present disclosure. Therefore, the scope claimed by the present disclosure is only defined by the scope of the claims.

The application claims priority to the Chinese patent application No. 201610371246.9, filed May 30, 2016, the entire disclosure of which is incorporated herein by reference as part of the present application.

What is claimed is:

1. A shift register, comprising:
   an input module, a first terminal of the input module being connected with an input terminal of the shift register to receive an input signal therefrom, a second terminal of the input module being connected with a first clock signal terminal, and a third terminal of the input module being connected with a first node;
   a pull-up module, a first terminal of the pull-up module being connected with a first supply voltage terminal, a second terminal of the pull-up module being connected with a second node, and a third terminal of the pull-up module being connected with an output terminal;
a pull-up control module, a first terminal of the pull-up control module being connected with the first clock signal terminal, a second terminal of the pull-up control module being connected with a second supply voltage terminal, a third terminal of the pull-up control module being connected with the second node, and a fourth terminal of the pull-up control module being connected with the first node;
an output module, a first terminal of the output module being connected with the first node, a second terminal of the output module being connected with the second clock signal terminal, and a third terminal of the output module being connected with the output terminal; and
a noise reducing module, a first terminal of the noise reducing module being connected with the second node, a second terminal of the noise reducing module being connected with the second clock signal terminal, a third terminal of the noise reducing module being connected with the first supply voltage terminal, and a fourth terminal of the noise reducing module being connected with the first node,
wherein the noise reducing module comprises:
a node control transistor having its gate connected with the second node and its first electrode connected with the second clock signal terminal; and
a node potential maintaining transistor having its gate connected with the second electrode of the node control transistor, its first electrode connected with the first supply voltage terminal, and its second electrode connected with the first node.

2. The shift register of claim 1, wherein the input module comprises an input transistor having its gate connected with the first clock signal terminal, its first electrode connected with the input terminal and its second electrode connected with the first node.

3. The shift register of claim 1, wherein the pull-up module comprises:
an output pull-up transistor having its gate connected with the second node, its first electrode connected with the first supply voltage terminal and its second electrode connected with the output terminal; and
a first capacitor having its first terminal connected with the second node and its second terminal connected with the first supply voltage terminal.

4. The shift register of claim 1, wherein the pull-up control module comprises:
a first pull-up control transistor having its gate connected with the first clock signal terminal, its first electrode connected with the second supply voltage terminal and its second electrode connected with the second node; and
a second pull-up control transistor having its gate connected with the first node, its first electrode connected with the second node and its second electrode connected with the first clock signal terminal.

5. The shift register of claim 1, wherein the output module comprises:
an output transistor having its gate connected with the first node, its first electrode connected with output terminal and its second electrode connected with the second clock signal terminal; and
a second capacitor having its first terminal connected with the first node and its second terminal connected with the output terminal.

6. The shift register of claim 4, wherein the transistors are all p-type transistors.

7. The shift register of claim 1, wherein the second clock signal at the second clock signal terminal and the first clock signal at the first clock signal terminal are opposite in phase.

8. The shift register of claim 1, wherein the first supply voltage terminal is a high supply voltage terminal while the second supply voltage terminal is a low supply voltage terminal.

9. A gate driving circuit comprising a plurality of shift registers connected in series, each of the shift registers being the shift register of claim 1,
wherein, among the plurality of shift registers connected in series, the first shift register receives a frame starting signal input through its input terminal, and except the last shift register, each of remaining shift registers has an output terminal thereof connected with the input terminal of a subsequently adjacent shift register.

10. The gate driving circuit of claim 9, wherein
clock signals input through first clock signal terminals in two adjacent stages of shift registers are opposite in phase, and clock signals input through second clock signal terminals in two adjacent stages of shift registers are also opposite in phase.

11. A display device comprising the gate driving circuit of claim 9.

12. A display device comprising the gate driving circuit of claim 10.

13. The shift register of claim 2, wherein the pull-up module comprises:
an output pull-up transistor having its gate connected with the second node, its first electrode connected with the first supply voltage terminal and its second electrode connected with the output terminal; and
a first capacitor having its first terminal connected with the second node and its second terminal connected with the first supply voltage terminal.

14. The shift register of claim 2, wherein the pull-up control module comprises:
a first pull-up control transistor having its gate connected with the first clock signal terminal, its first electrode connected with the second supply voltage terminal and its second electrode connected with the second node; and
a second pull-up control transistor having its gate connected with the first node, its first electrode connected with the second node and its second electrode connected with the first clock signal terminal.

15. The shift register of claim 2, wherein the output module comprises:
an output transistor having its gate connected with the first node, its first electrode connected with output terminal and its second electrode connected with the second clock signal terminal; and
a second capacitor having its first terminal connected with the first node and its second terminal connected with the output terminal.

16. An operation method for a shift register comprising an input module, a pull-up module, a pull-up control module, an output module and a noise reducing module, the operation method comprising:
transferring a received input signal to a first node by the input module;
outputting a second clock signal at a second clock signal terminal to an output terminal by the output module;
controlling the pull-up module to operate or not operate by the pull-up control module;

pulling the output signal at the output terminal up to a supply voltage at a first supply voltage terminal by the pull-up module; and maintaining a level at the first node to reduce noises at the output terminal of the shift register by the noise reducing module, wherein the noise reducing module comprises:

a node control transistor having its gate connected with a second node and its first electrode connected with the second clock signal terminal; and a node potential maintaining transistor having its gate connected with the second electrode of the node control transistor, its first electrode connected with the first supply voltage terminal, and its second electrode connected with the first node.

17. The method of claim 16, wherein the first supply voltage terminal is a high supply voltage terminal.

18. The operation method of claim 17, wherein the second clock signal at the second clock signal terminal and the first clock signal at the first clock signal terminal are opposite in phase.

* * * * *